United States Patent
Chen et al.

(10) Patent No.: US 6,350,681 B1
(45) Date of Patent: Feb. 26, 2002

(54) METHOD OF FORMING DUAL DAMASCENE STRUCTURE

(75) Inventors: Anseime Chen, Hsinchu; Chingfu Lin, Taipei; Yi-Fang Cheng, Yunglin Hsien; I-Hsiung Huang, Kaohsiung, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/780,549

(22) Filed: Feb. 9, 2001

(30) Foreign Application Priority Data

Jan. 17, 2001 (TW) .......................................... 90101008

(51) Int. Cl.$^7$ .......................................... H01L 21/4763
(52) U.S. Cl. ........................ 438/637; 438/635; 438/636
(58) Field of Search ................................. 438/635, 636, 438/637, 631, 633, 634, 687

(56) References Cited

U.S. PATENT DOCUMENTS

| | | | | |
|---|---|---|---|---|
| 6,071,810 A | * | 6/2000 | Wada et al. | ................. 438/635 |
| 6,096,648 A | * | 8/2000 | Lopatin et al. | ............. 438/687 |
| 6,159,845 A | * | 12/2000 | Yew et al. | ................... 438/637 |
| 6,265,313 B1 | * | 7/2001 | Huang et al. | ................ 438/687 |

* cited by examiner

Primary Examiner—David Nelms
Assistant Examiner—Thao P. Le
(74) Attorney, Agent, or Firm—Thomas, Kayden, Horstemeyer & Risley

(57) ABSTRACT

A method of forming a multiple layer damascene structure. A substrate comprising of a multi-layered stack that includes, from bottom to top, a metallic layer, a first etching stop layer, a first dielectric layer, a second etching stop layer and a second dielectric layer is provided. A photoresist layer having large area openings and vias pattern is formed over the substrate. Large area openings and vias that expose a portion of the first etching stop layer are formed in the substrate. A barrier layer that fills all the large area openings and vias is formed over the substrate. Chemical-mechanical polishing is conducted to remove a portion of the barrier layer and expose the second dielectric layer. A second photoresist having a trench pattern thereon is formed over the substrate. Using the second photoresist as a mask, etching is conducted so that the second etching stop layer around the vias is exposed. Lastly, the barrier layer is removed.

18 Claims, 2 Drawing Sheets

METHOD OF FORMING DUAL DAMASCENE STRUCTURE

CROSS-REFERENCE TO RELATED APPLICATION

This application claims the priority benefit of Taiwan application serial no. 90101008, filed Jan. 17, 2001.

BACKGROUND OF THE INVENTION

1. Field of Invention

The present invention relates to a method of manufacturing a metal-oxide-semiconductor (MOS) device. More particularly, the present invention relates to a method of forming a dual damascene structure in a MOS device.

2. Description of Related Art

Multiple layer damascene techniques are frequently applied to form metallic interconnects having a line width smaller than 0.18 μm. Metallic interconnects in different layers are often electrically connected by vias. Hence, the via-forming process is also important in the fabrication of metallic interconnects.

In a conventional interconnect fabrication process, a photoresist layer that serves as a mask must be formed. However, when the surface of the photoresist layer to the bottom of a via is more than 8000 Å, light from a light source may not reach the photoresist material near the bottom of the via opening (depth exceeding 8000 Å). Consequently, structural change to the positive photoresist may not occur and hence some photoresist may remain in the via after chemical development. The residual photoresist may react with low dielectric constant dielectric material in a subsequent step when the trench portion of a damascene opening is formed by etching. Ultimately, a short sidewall is formed in the area between the via and the trench close to the via sidewalls that may have some averse effects on the fabrication of interconnects.

Another conventional technique is to deposit a high molecular weight layer before coating the photoresist layer so that the effect of via depth on photoresist dissociation is minimized. This method is effective in preventing short sidewall. In general, however, different size openings and vias are form on a silicon wafer in MOS device fabrication. Thus, if a thin barrier layer is deposited over the wafer, high molecular weight layer of different thickness may form depending on the size of the vias and the openings. Subsequently, when the high molecular weight layer needs to be removed, the thinner high molecular weight layer at the bottom of large area openings may be over-etched leading to possible damages of bottom section of the opening. If the metallic layer at the bottom of the large area opening is damage, short-circuiting between interconnects may occur.

SUMMARY OF THE INVENTION

Accordingly, one object of the present invention is to provide a method of forming a barrier layer. The barrier material fills large area openings and vias of various sizes on a silicon wafer so that a flat wafer surface is obtained. The flat wafer surface prevents any residue photoresist material from sticking to the wafer surface after photo-exposure and photoresist development.

In addition, the barrier layer of this invention is flushed on the silicon wafer surface. In other words, the barrier plugs of various widths in different portions of the wafer all have an identical thickness. Hence, barrier plugs in various portions can be removed without causing any damages to the large area openings and vias of various sizes.

To achieve these and other advantages and in accordance with the purpose of the invention, as embodied and broadly described herein, the invention provides a method of forming a multiple layer damascene structure. A substrate comprising of a multi-layered stack that includes, from bottom to top, a metallic layer, a first etching stop layer, a first dielectric layer, a second etching stop layer and a second dielectric layer is provided. A photoresist layer having large area openings and vias pattern is formed over the substrate. Large area openings and vias that expose a portion of the first etching stop layer are formed in the substrate. A barrier layer that fills all the large area openings and vias is formed over the substrate. Chemical-mechanical polishing is conducted to remove a portion of the barrier layer and expose the second dielectric layer. A second photoresist having a trench pattern thereon is formed over the substrate. Using the second photoresist as a mask, etching is conducted so that the second etching stop layer around the vias is exposed. Lastly, the barrier layer is removed.

The barrier layer in this invention fills the large area openings and vias of various sizes so that a planar wafer surface is produced. Consequently, a photoresist layer having a uniform thickness can be formed in a multiple layer damascene process. Therefore, no residue photoresist material will remain in the light-exposed positions after photo-exposure and photoresist development.

The barrier plugs completely occupy the large area openings and the vias completely. Since uniformly thick barrier plugs are formed on the wafer surface independent of the size of the plug, damages to the bottom section of the large area openings and vias due to over-etching can be prevented.

In addition, the barrier layer is immediately formed after large area openings and vias are patterned out. Since there is no need to remove the photoresist layer first, a few production steps is saved compared with the conventional technique.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
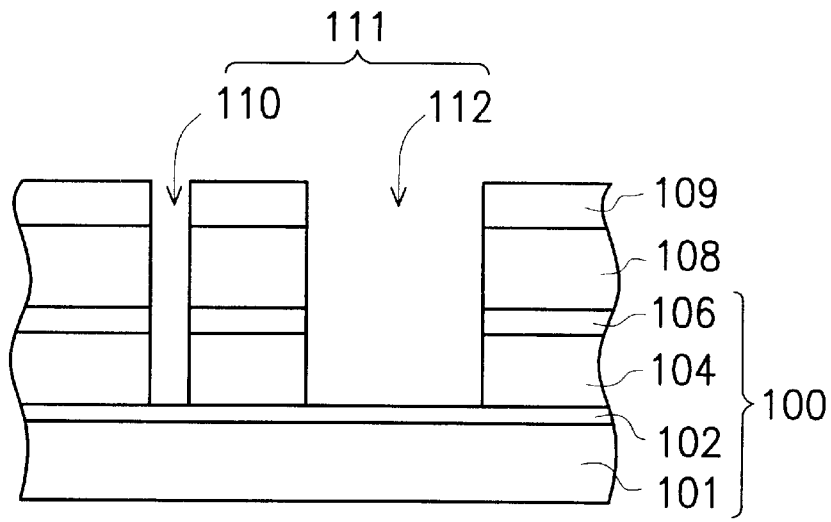
FIGS. 1 through 5 are schematic cross-sectional views showing the progression of steps for forming a dual damascene structure according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1 through 5 are schematic cross-sectional views showing the progression of steps for forming a dual damascene structure according to one preferred embodiment of this invention. As shown in FIG. 1, a metal-oxide-semiconductor (MOS) transistor (not shown) having a substrate thereon is provided. The substrate 100 comprises of a stack of layers including, from bottom to top, a metallic layer 101, a first etching stop layer 102, a first dielectric layer 104, a second etching stop layer and a second dielectric layer 108. The substrate 100 and the MOS transistor are formed by conventional techniques. The metallic layer is a copper layer. The first etching stop layer 102 and the second etching stop layer 106 are silicon oxynitride layers or silicon nitride layers. The first dielectric layer 104 and the second dielectric layer 108 are low dielectric constant organic dielectric layers having a dielectric constant between 3.0 to 4.0.

A first photoresist layer 109 is formed over the second dielectric layer 108. Photo-exposure and photoresist development is conducted to form a pattern (not shown) for forming large area openings and vias. Using the first photoresist layer 109 as a mask, openings 111 that expose a portion of the first etching stop layer 102 are formed in the substrate 100. The openings 111 includes a large area opening 112 and a via hole 110.

Figure 2:
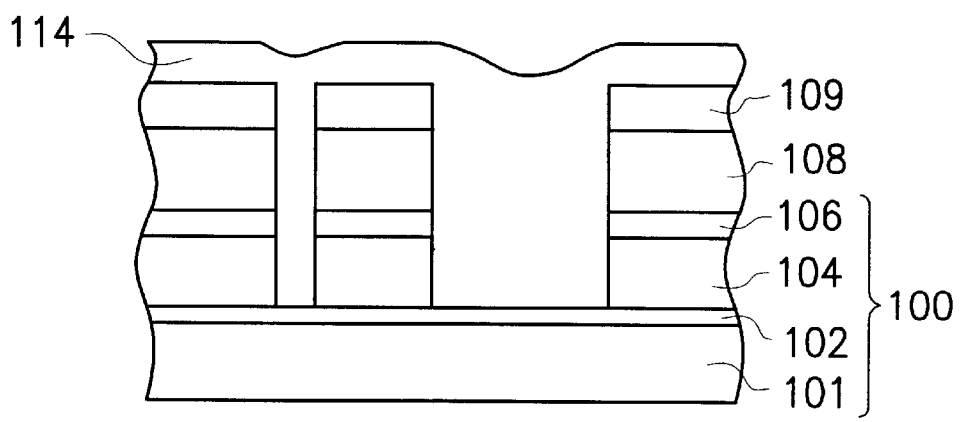

As shown in FIG. 2, a barrier layer 114 is formed over the first photoresist layer 109 and the substrate 100. The barrier layer 114 also fills the openings 111. The barrier layer can be an organic bottom anti-reflection coating (BARC) or a high molecular weight coating formed, for example, by performing a coating operation.

Figure 3:
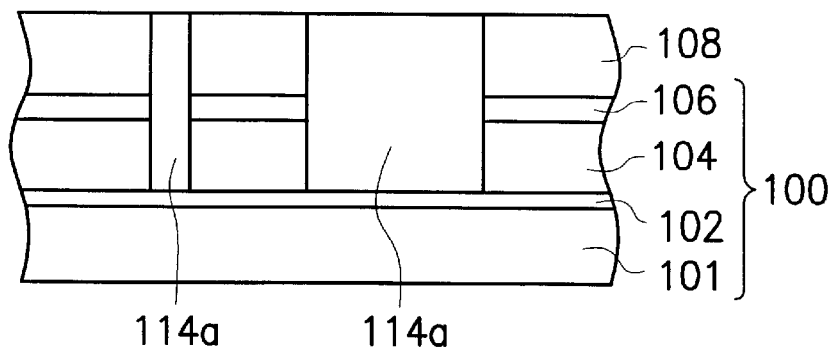

As shown in FIG. 3, chemical-mechanical polishing is conducted to remove the first photoresist layer 109 and portion of the barrier layer 114. Ultimately, the second dielectric layer 108 is exposed and barrier plugs 114a are formed in the substrate 100. The barrier plugs 114a prevent the formation of an unevenly thick photoresist layer in a subsequent photoresist deposition.

Figure 4:
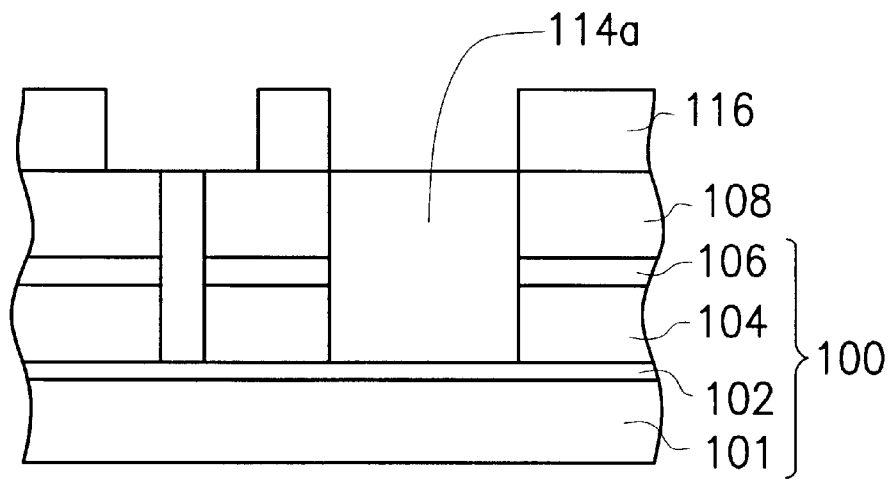

As shown in FIG. 4, a second photoresist layer 116 is formed over the substrate 100 and the barrier plugs 114a. The second photoresist layer 116 is photo-exposed and developed to form a pattern for forming trenches.

Figure 5:
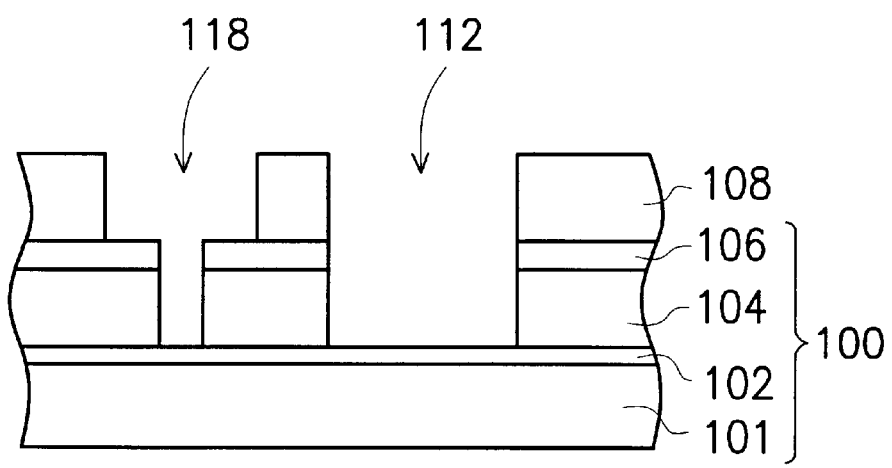

As shown in FIG. 5, etching technique is applied to remove a portion of the exposed second dielectric layer 108 so that a portion of the second etching stop layer 106 is exposed. Thereafter, the photoresist layer 116 and the barrier plugs 114a are removed to form a multiple layer damascene opening 118 and the large area opening 112.

In this invention, the barrier layer completely fills the large area openings and vias of various sizes on a wafer so that a planar upper surface is obtained. With a planar surface, a uniformly thick photoresist layer can be deposited over the wafer in the fabrication of a multiple layer damascene opening. A uniformly thick photoresist layer can prevent photoresist residue from adhering to the light-exposed positions after photo-exposure and development.

The barrier plugs completely occupy the large area openings and the vias completely. Since uniformly thick barrier plugs are formed on the wafer surface independent of the size of the plug, damages to the bottom section of the large area openings and vias due to over-etching can be prevented.

In addition, the barrier layer is immediately formed after large area openings and vias are patterned out. Since there is no need to remove the photoresist layer first, a few production steps is saved compared with the conventional technique.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a dual damascene structure, comprising the steps of:

providing a substrate composed of a stack of layers that includes, from bottom to top, a metallic layer, a first etching stop layer, a first dielectric layer, a second etching stop layer and a second dielectric layer, wherein the second dielectric layer, the second etching stop layer and the first dielectric layer has a plurality of openings that exposes a portion of the first etching stop layer, and the openings can be subdivided into large area openings and via holes;

forming a barrier layer over the substrate so that all the openings are completely filled;

performing chemical-mechanical polishing to remove the barrier layer material outside the openings;

etching the second dielectric layer to form a trench using the second etching stop layer as an etching stop so that the trench passes over the via hole; and removing the barrier layer.

2. The method of claim 1, wherein the step of forming the trench includes dry etching.

3. The method of claim 1, wherein the barrier layer includes an organic bottom anti-reflection coating.

4. The method of claim 1, wherein the barrier layer includes a high molecular weight layer.

5. The method of claim 1, wherein the metallic layer includes a copper layer.

6. The method of claim 1, wherein the first dielectric layer includes an organic dielectric layer formed using a dielectric material that has a dielectric constant between 3.0 to 4.0.

7. The method of claim 1, wherein the first etching stop layer includes a silicon oxynitride layer or a silicon nitride layer.

8. The method of claim 1, wherein the second dielectric layer includes an organic dielectric layer formed using a dielectric material that has a dielectric constant between 3.0 to 4.0.

9. The method of claim 1, wherein the second etching stop layer includes a silicon oxynitride layer or a silicon nitride layer.

10. A method of forming a dual damascene structure, comprising the steps of providing a substrate, wherein the substrate is a multi-layered stack including, from bottom to top, a metallic layer, a first etching stop layer, a first dielectric layer, a second etching stop layer and a second dielectric layer;

forming a first photoresist layer over the second dielectric layer;

forming a plurality of opening patterns on the first photoresist layer, wherein the opening pattern includes patterns for forming large area openings and via holes;

etching the exposed second dielectric layer, the second etching stop layer and the first dielectric layer to form a plurality of openings using the first photoresist layer as a mask and the first etching stop layer and an etching stop, wherein the openings includes large area openings and via holes;

forming a barrier layer over the residual first photoresist layer and the substrate, wherein the barrier layer also fills the openings;

performing chemical-mechanical polishing to remove the barrier layer outside the openings and any residual first photoresist layer;

etching the second dielectric layer to form trenches using the second etching stop layer as an etching stop so that each trench passes over a via hole; and removing the barrier layer.

11. The method of claim 10, wherein the step of forming the trench includes dry etching.

12. The method of claim 10, wherein the barrier layer includes an organic bottom anti-reflection coating.

13. The method of claim 10, wherein the barrier layer includes a high molecular weight layer.

14. The method of claim 10, wherein the metallic layer includes a copper layer.

15. The method of claim 10, wherein the first dielectric layer includes an organic dielectric layer formed using a dielectric material that has a dielectric constant between 3.0 to 4.0.

16. The method of claim 10, wherein the first etching stop layer includes a silicon oxynitride layer or a silicon nitride layer.

17. The method of claim 10, wherein the second dielectric layer includes an organic dielectric layer formed using a dielectric material that has a dielectric constant between 3.0 to 4.0.

18. The method of claim 10, wherein the second etching stop layer includes a silicon oxynitride layer or a silicon nitride layer.

* * * * *